(12) United States Patent
Lee et al.

(10) Patent No.: US 9,640,550 B2
(45) Date of Patent: May 2, 2017

(54) SEMICONDUCTOR DEVICE HAVING THREE-DIMENSIONAL STRUCTURE AND METHOD OF MANUFACTURING THE SAME

(71) Applicant: SK hynix Inc., Gyeonggi-do (KR)

(72) Inventors: Ki Hong Lee, Gyeonggi-do (KR); Seung Ho Pyi, Gyeonggi-do (KR); Jin Ho Bin, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/264,349

(22) Filed: Sep. 13, 2016

(65) Prior Publication Data

US 2017/0005109 A1    Jan. 5, 2017

Related U.S. Application Data

(63) Continuation of application No. 14/480,207, filed on Sep. 8, 2014, now Pat. No. 9,472,567.

(30) Foreign Application Priority Data

Apr. 16, 2014  (KR) .................. 10-2014-0045557

(51) Int. Cl.
| | | |
|---|---|---|
| *H01L 21/336* | (2006.01) | |
| *H01L 27/11582* | (2017.01) | |
| *H01L 27/11565* | (2017.01) | |
| *H01L 27/11578* | (2017.01) | |
| *H01L 27/11553* | (2017.01) | |
| *H01L 27/11556* | (2017.01) | |
| *H01L 21/768* | (2006.01) | |
| *H01L 27/11573* | (2017.01) | |
| *H01L 27/11575* | (2017.01) | |

(52) U.S. Cl.
CPC .. *H01L 27/11582* (2013.01); *H01L 21/76843* (2013.01); *H01L 21/76849* (2013.01); *H01L 21/76877* (2013.01); *H01L 27/11553* (2013.01); *H01L 27/11556* (2013.01); *H01L 27/11565* (2013.01); *H01L 27/11573* (2013.01); *H01L 27/11575* (2013.01); *H01L 27/11578* (2013.01)

(58) Field of Classification Search
CPC ......... H01L 21/76849; H01L 21/76843; H01L 21/76877; H01L 27/11582; H01L 27/11565; H01L 27/11578; H01L 27/11553; H01L 27/11556; H01L 27/11573; H01L 27/11575
See application file for complete search history.

(56) References Cited

U.S. PATENT DOCUMENTS

2013/0270714 A1\*  10/2013  Lee ................... H01L 21/76802
257/774

\* cited by examiner

*Primary Examiner* — Jesse Y Miyoshi
(74) *Attorney, Agent, or Firm* — IP & T Group LLP

(57) ABSTRACT

A semiconductor device includes a semiconductor pattern; conductive layers each including a first portion through which the semiconductor pattern passes and a second portion having a thickness greater than the first portion, wherein the first portion of each conductive layer includes a first barrier pattern surrounding the semiconductor pattern and a material pattern, which is formed in the first barrier pattern and has an etch selectivity with respect to the first barrier pattern, and the second portion of each conductive layer includes a conductive pattern; and contact plugs connected to the second portion of each of the conductive layers.

10 Claims, 15 Drawing Sheets

SEMICONDUCTOR DEVICE HAVING THREE-DIMENSIONAL STRUCTURE AND METHOD OF MANUFACTURING THE SAME

CROSS-REFERENCE TO RELATED APPLICATION

This application is a continuation of U.S. patent application Ser. No. 14/480,207 filed on Sep. 8, 2014, which claims priority to Korean patent application number 10-2014-0045557, filed on Apr. 16, 2014. The disclosure of each of the foregoing application is incorporated herein by reference in its entirety.

BACKGROUND

Field of Invention

Various embodiments of the present invention relate to a semiconductor device, and more particularly, to a semiconductor device having a three-dimensional (3D) structure, and a method of manufacturing the same.

Description of Related Art

Non-volatile memory devices retain data stored therein even when not powered. Two-dimensional memory devices, which are manufactured as a single layer on a silicon substrate, are reaching physical limits for increasing the degree of integration. Accordingly, 3D non-volatile memory devices have been proposed that have memory cells stacked in a vertical direction on a silicon substrate.

A 3D nonvolatile memory device includes interlayer insulating layers and gate electrodes stacked alternately with each other, and channel layers passing therethrough. Memory cells are stacked along the channel layers. The 3D nonvolatile memory device is manufactured by alternately stacking a plurality of interlayer insulating layers, for example, oxide layers, and a plurality of sacrificial layers, such as, nitride layers, and then replacing the sacrificial layers with a plurality of conductive layers to form stacked gate electrodes.

However, replacing the sacrificial layers with the conductive layers may be a difficult process. After the process of replacing the sacrificial layers, reactive gases may remain in the stacked structure and may damage the conductive layers. As a result, characteristics of the memory device may be deteriorated.

SUMMARY

Various embodiments of the present invention are directed to a semiconductor device capable of securing characteristics of a device, and a method of manufacturing the same.

A semiconductor device according to an exemplary embodiment of the present invention may include a semiconductor pattern; conductive layers each including a first portion through which the semiconductor pattern passes and a second portion having a thickness greater than the first portion, wherein the first portion of each conductive layer includes a first barrier pattern surrounding the semiconductor pattern and a material pattern, which is formed in the first barrier pattern and has an etch selectivity with respect to the first barrier pattern, and the second portion of each conductive layer includes a conductive pattern; and contact plugs connected to the second portion of each of the conductive layers.

A semiconductor device according to another embodiment of the present invention may include insulating layers stacked in a stepwise manner; conductive layers disposed between the insulating layers, wherein each of the conductive layers includes a first portion corresponding to a cell region and covered by an upper conductive layer, a second portion corresponding to a pad region, and a third portion corresponding to a connection region and located between the first portion and the second portion, and wherein each of the conductive layers of the first portion and the third portion includes a material different from that of the second potion; channel layers passing through the first portion of each of the conductive layers; and contact plugs connected to the second portion of each of the conductive layers.

A method of manufacturing a semiconductor device according to an embodiment of the present invention may include forming a stacked structure including a semiconductor pattern, and first material layers and second material layers stacked alternately to surround the semiconductor pattern, forming a slit passing through the stacked structure, forming first openings by removing the first material layers through the slit, forming a first barrier layer in the first openings and the slit, forming a third material layer in the first openings and the slit where the first barrier layer is formed, wherein the third material layer has an etch selectivity with respect to the first barrier layer and includes seams located in the first openings, forming sacrificial patterns filling the seams, forming second openings by partially etching the first barrier layer, the third material layer, and the sacrificial patterns formed in the first openings, and forming conductive patterns in the second openings.

DETAILED DESCRIPTION

Figure 1A:
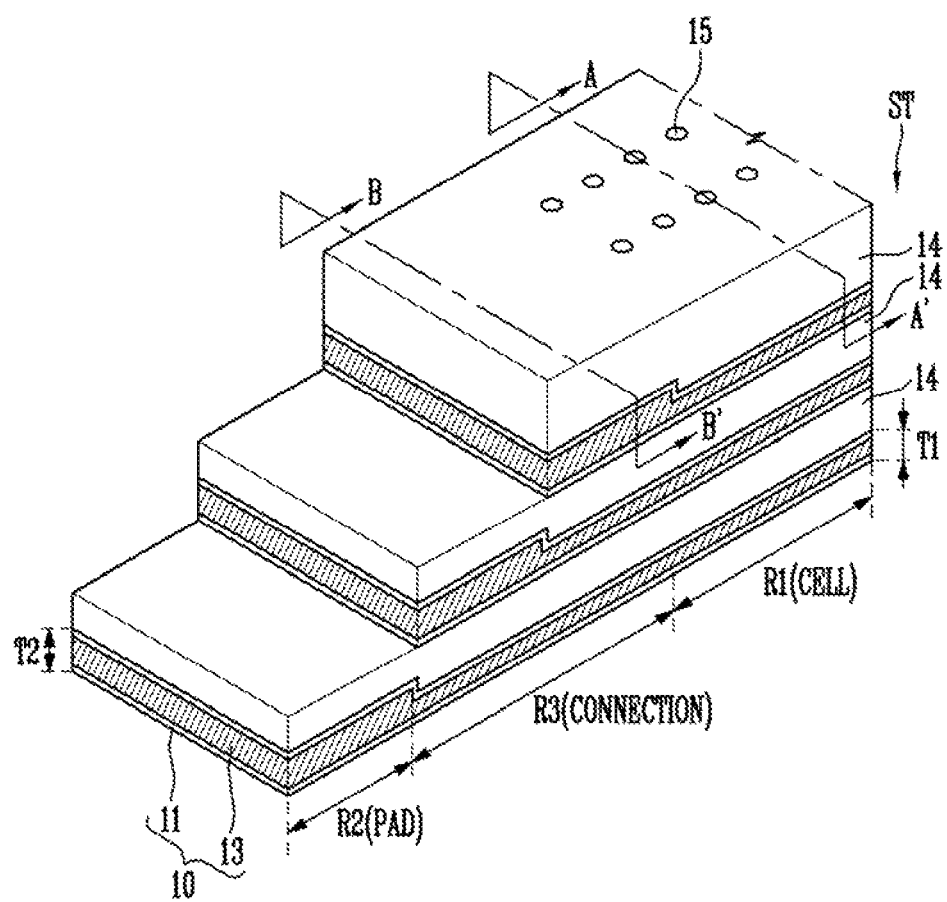
FIG. 1A is a perspective view illustrating a semiconductor device according to an embodiment of the present invention.

Hereinafter, various exemplary embodiments of the present invention will be described in detail with reference to the accompanying drawings.

The drawings may not be necessarily to scale and, in some instances, proportions of at least some of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure, for example, one or more additional layers may be present between two illustrated layers. As a specific example, when a first layer in a described or illustrated multi-layer structure is referred to as being "on" or "over" a second layer, or "on" or "over" a substrate, the first layer may be directly formed on the second layer or the substrate but may also represent a structure where one or more other intermediate layers may exist between the first layer and the second layer or the substrate. It is also noted that in this specification, "connected/coupled" refers to one component not only directly coupling another component but also indirectly coupling another component through an intermediate component. In addition, a singular form may include a plural form as long as it is not specifically mentioned in a sentence.

In the drawings, thicknesses and a distance of components are exaggerated compared to an actual physical thickness and interval, for convenience of illustration. In the following description, detailed descriptions of known related functions and constitutions may be omitted to avoid unnecessarily obscuring the subject manner of the present invention. Like reference numerals refer to like elements throughout the specification and drawings.

FIG. 1A is a perspective view illustrating a semiconductor device according to an embodiment of the present invention.

As illustrated in FIG. 1A, the semiconductor device may include a stacked structure ST where conductive layers 10 and insulating layers 14 are alternately formed, and a semiconductor pattern 15 passing through the stacked structure ST. The conductive layers 10 may be gate electrodes such as cell transistors and memory cells, or selection lines or word lines. Furthermore, the semiconductor pattern 15 may be a channel layer.

Each of the conductive layers 10 includes a first portion R1 surrounding the semiconductor pattern 15 and a second portion R2 extending from the first portion R1. The second portion R2 of each conductive layer 10 may have a thickness greater than the first portion R1, that is, T2>T1. For example, the first portion R1 may correspond to a cell region where memory cells are located, and the second portion R2 may correspond to a pad region to which a contact plug is connected. An upper conductive layer may be stacked to cover the first portion R1 of a lower conductive layer 10 and expose the second portion R2 thereof.

Each conductive layer 10 may further include a third portion R3 located between the first portion R1 and the second portion R2. The third portion R3 may have substantially the same thickness as the first portion R1. For example, the third portion (R3) may correspond to a connection region located between the cell region and the pad region. An upper conductive layer 10 may be stacked to cover the first and third portions R1 and R3 of the lower conductive layer 10, and to expose the second portion R2 of the lower conductive layer 10. Furthermore, the third portion R3 of the lower conductive layer 10 may be located below the second and third portions R2 and R3 of an upper conductive layer 10. In the semiconductor device having the above-described structure, the lower conductive layer 10 has a length greater than the upper conductive layer 10, and the third portion R3 of the lower conductive layer 10 may have a length greater than that of the upper conductive layer 10. For example, the first portion R1 of the upper conductive layer 10 and the first portion R1 of the lower conductive layer 10 have the same length, whereas the third portion R3 of the lower conductive layer 10 has a length greater than the third portion R3 of the upper conductive layer 10.

In FIG. 1A, the first to third portions R1 to R3 of the conductive layers 10 at the lowest part are illustrated, and the first to third portions R1 to R3 of the conductive layers 10 are defined to have different lengths. Additionally, the uppermost conductive layer 10 may not include the third portion R3.

Figure 1B:
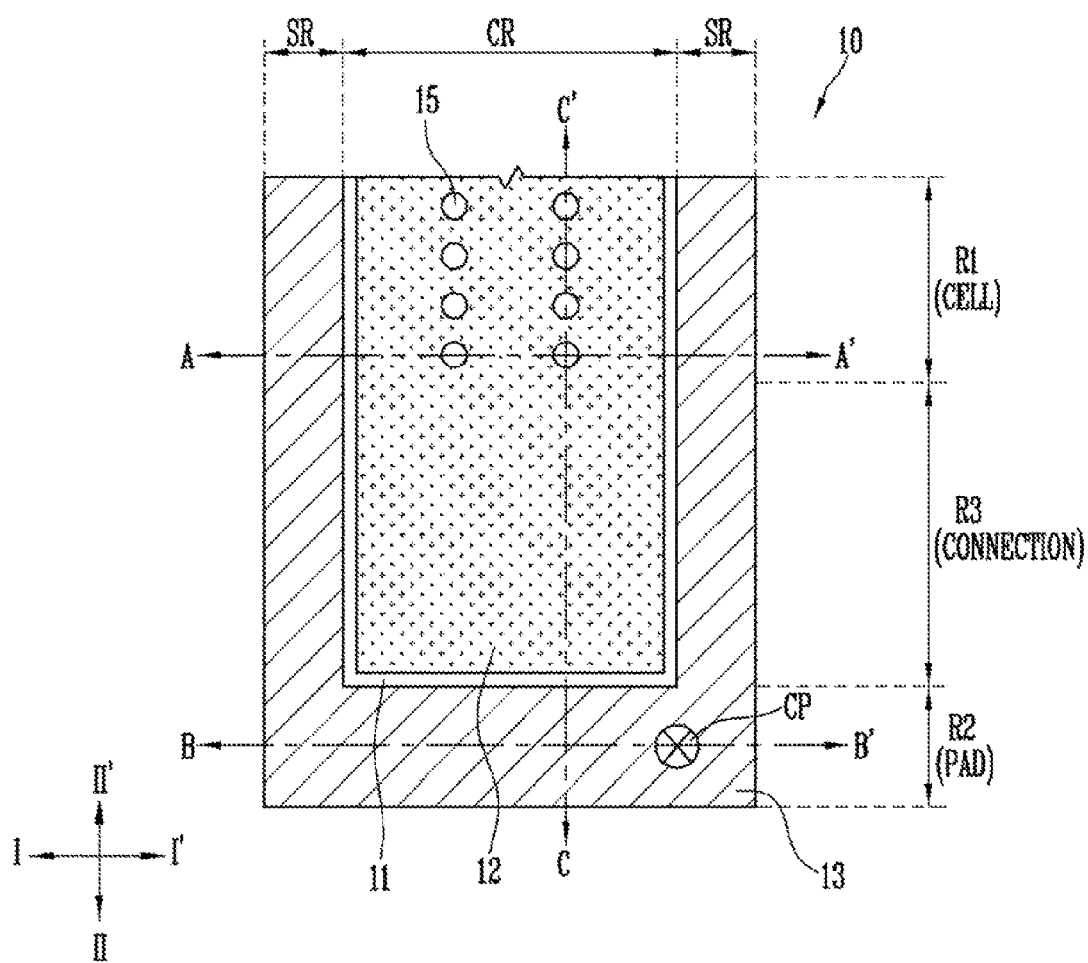
FIG. 1B is a layout view illustrating an example of the structure of a conductive layer included in the semiconductor device shown in FIG. 1A.
Figure 1C:
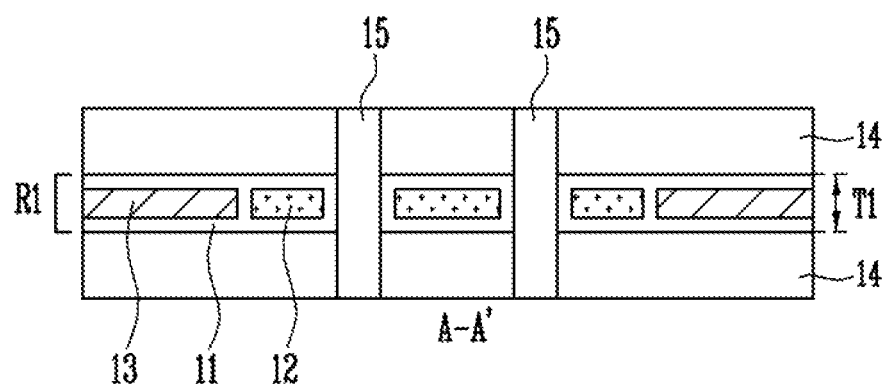
FIG. 1C is a layout view along A-A' illustrating the structure of the conductive layer shown in FIG. 1B.
Figure 1D:
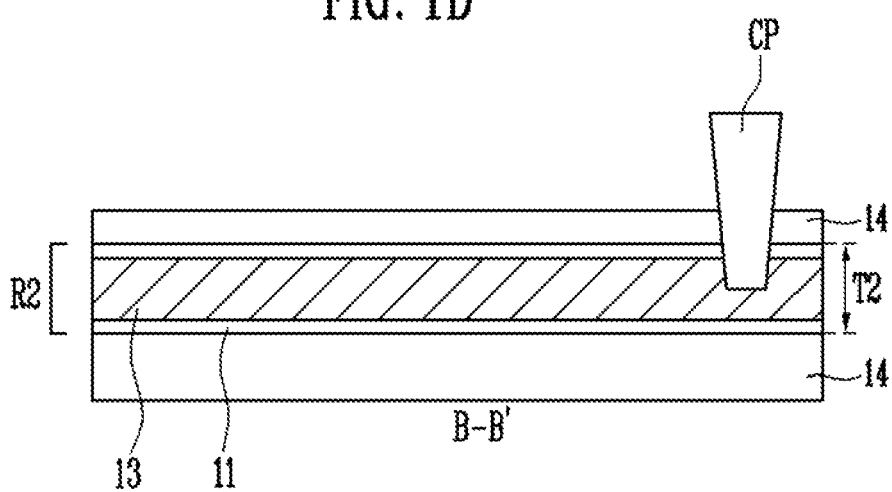
FIG. 1D is a layout view along B-B' illustrating the structure of the conductive layer shown in FIG. 1B.
Figure 1E:
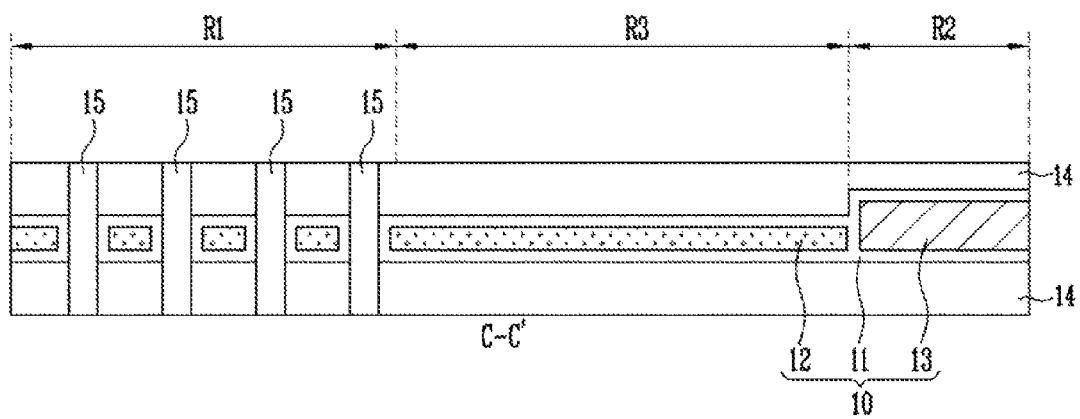
FIG. 1E is a layout view along C-C' illustrating the structure of the conductive layer shown in FIG. 1B.

FIGS. 1B to 1E are views illustrating an example of the structure of the conductive layer 10 included in the semiconductor device shown in FIG. 1A. FIG. 1B is a layout view, FIG. 1C is a cross-sectional view along A-A', FIG. 1D is a cross-sectional view along B-B', and FIG. 1E is a cross-sectional view along C-C'. Hereinbelow, a detailed description of the earlier described common functions and embodiments are omitted.

As illustrated in FIG. 1B, in the conductive layer 10, the first portion R1 and the third portion R3 may have substantially the same structure, and the first portion R1 and the second portion R2 may have different structures. That is, the first portion R1 and the third portion R3 may be formed of the same material, and the first portion R1 and the second portion R2 may be formed of different materials. For example, the first and third portions R1 and R3 of the conductive layer 10 may include in a barrier pattern 11 and a material pattern 12 located in the barrier pattern 11, and the second portion R2 thereof may include a conductive pattern 13.

Furthermore, the conductive layer 10 may have a central region CR and a side region SR located at both sides of the central region CR. The conductive pattern 13 formed in the second portion R2 may extend to the side region SR of the first and third portions R1 and R3. The barrier pattern 11 and the material pattern 12 are formed in the central region CR of the first and third portions R1 and R3, and the conductive pattern 13 is formed in the side region SR of the first and third portions R1 and R3.

The material pattern 12 may include a material having an etch selectivity with respect to the barrier pattern 11. For example, the material pattern 12 may include at least one of oxide, nitride, silicon oxide, silicon nitride, polysilicon, germanium, and silicon germanium. The barrier pattern 11 may include at least one of titanium, titanium nitride, tantalum and tantalum nitride. Furthermore, the conductive pattern 13 may include at least one of tungsten and tungsten nitride.

As illustrated in FIG. 1C, at least one semiconductor pattern 15 passes through the first portion R1. For example, the semiconductor pattern 15 may pass through the central region CR of the first portion R1 shown in FIG. 1B or boundaries of the central region CR and the side region SR shown in FIG. 1B.

As illustrated in FIG. 1D and FIG. 1E, a contact plug CP is connected to the second portion R2 of the conductive layer 10. By connecting the contact plug to the second portion R2 which is relatively thick, it may be possible to secure an overlay margin and prevent the conductive layer 10 from being punched and forming a bridge. FIG. 1D illustrates that the contact plug CP is located at the side of the second portion R2. However, the contact plug CP may be located at the center of the second portion R2.

Although not illustrated in FIGS. 1B to 1D, the conductive layer 10 may include an air gap in a portion thereof. For example, the air gap may be located in the central region CR of the first to third portions R1 to R3, or within the material pattern 12.

Figure 2A:
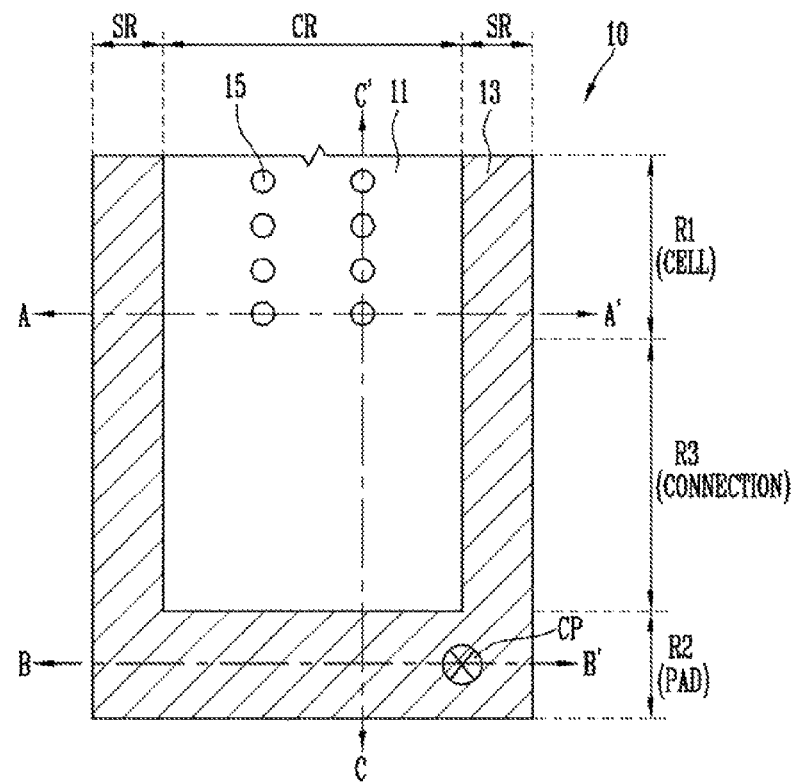
FIG. 2A is a layout view illustrating another example of the structure of a conductive layer included in the semiconductor device shown in FIG. 1A.
Figure 2B:
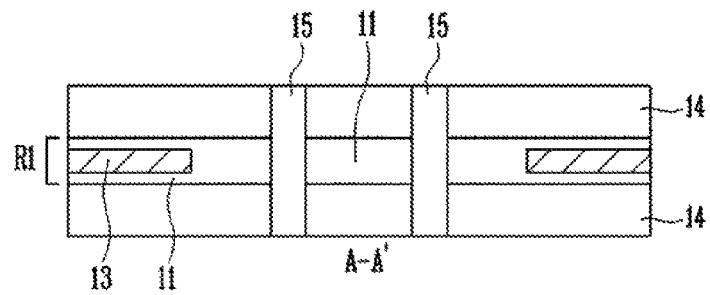
FIG. 2B is a layout view along A-A' illustrating the structure of the conductive layer shown in FIG. 2A.
Figure 2C:
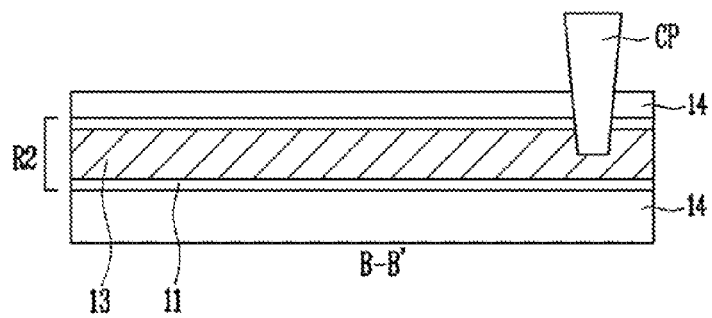
FIG. 2C is a layout view along B-B' illustrating the structure of the conductive layer shown in FIG. 2A.
Figure 2D:
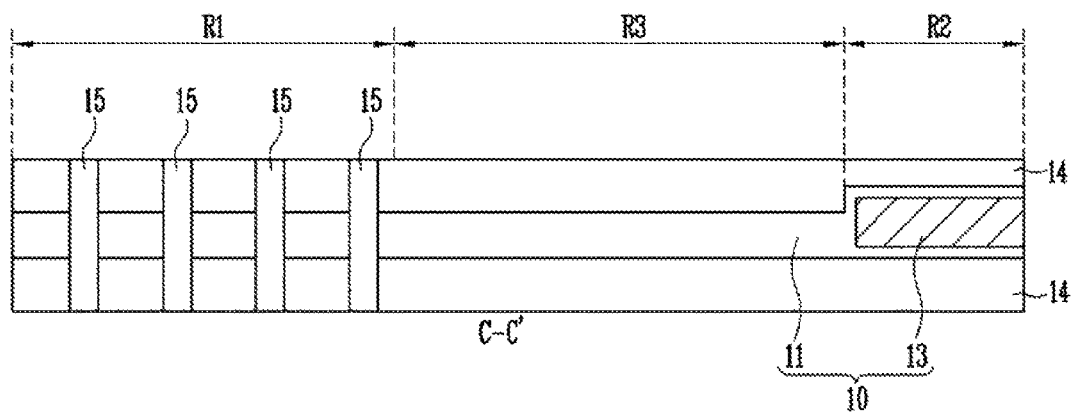
FIG. 2D is a layout view along C-C' illustrating the structure of the conductive layer shown in FIG. 2A.

FIGS. 2A to 2D are views illustrating another example of the structure of the conductive layer 10 shown in FIG. 1A. FIG. 2A is a layout view, FIG. 2B is a cross-sectional view along A-A', FIG. 2C is a cross-sectional view along B-B', and FIG. 2D is a cross-sectional view along C-C'. Hereinbelow, a description of the earlier described common functions and embodiments will be omitted.

As illustrated in FIGS. 2A to 2D, the conductive layer 10 may include the barrier pattern 11 filling the first portion and third portions R1 and R3, and the conductive pattern 13 formed in the second portion R2. Furthermore, the central region CR of the first and third portions R1 and R3 may be filled with the barrier pattern 11, and the conductive pattern 13 may be formed in the side region SR. Although not illustrated in these drawings, an air gap may be located in the barrier pattern 11.

FIGS. 3A and 3B to 10A and 10B are cross-sectional views illustrating a method of manufacturing a semiconductor device according to an embodiment of the present invention. FIGS. 3A, 4A, 5A, 6A, 7A, 8A, 9A and 10A are cross-sectional views taken along A-A' of FIG. 1A, and FIGS. 3B, 4B, 5B, 6B, 7B, 8B, 9B, and 10B cross-sectional views taken along B-B' of FIG. 1A. Hereinbelow, a detailed description of the common functions and embodiments previously described will be omitted.

Figure 3A:
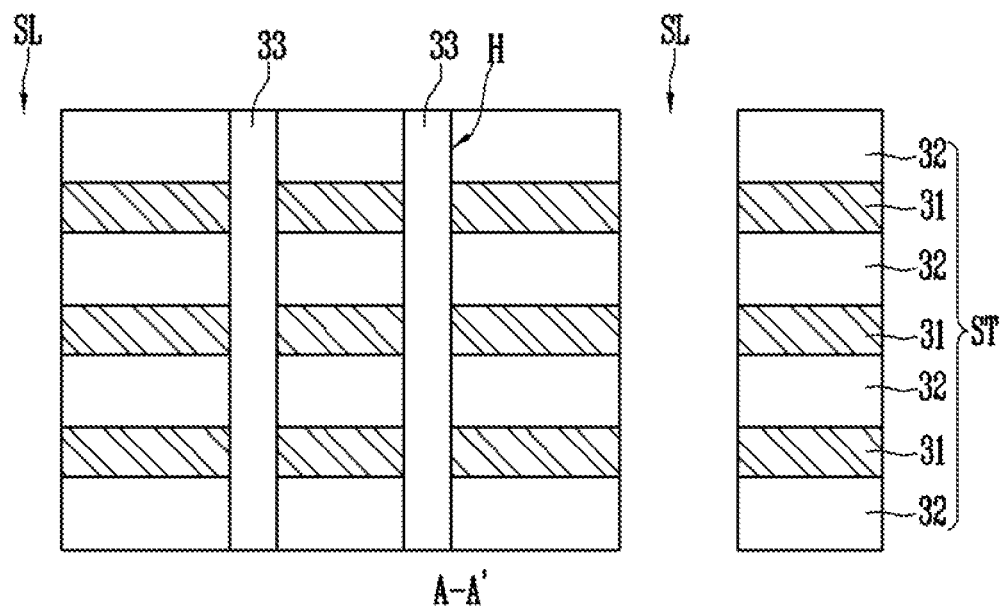
FIG. 3A is a cross-sectional view illustrating a method of manufacturing a semiconductor device according to an embodiment of the present invention.
Figure 3B:
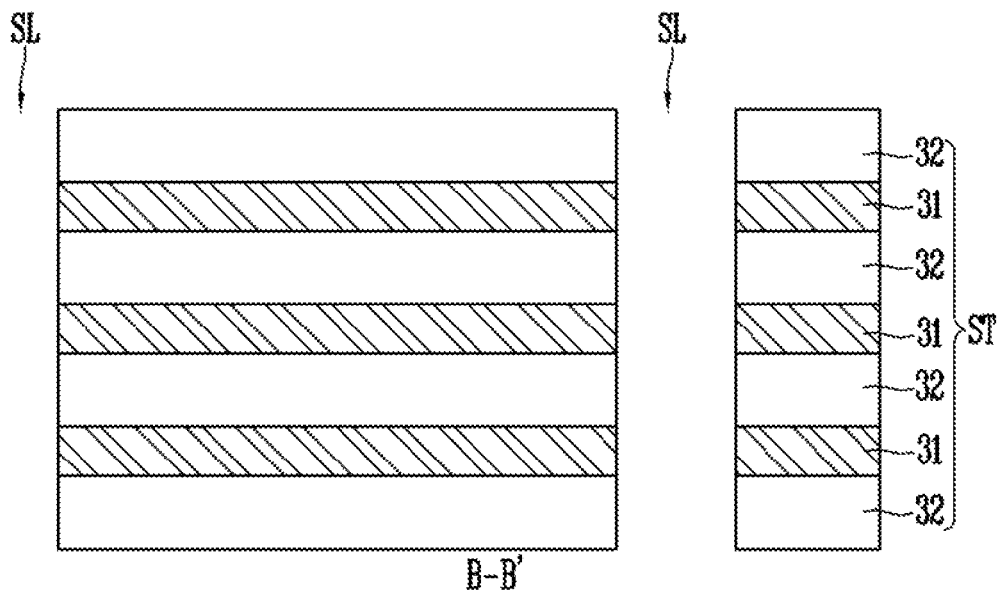
FIG. 3B is a cross-sectional view illustrating a method of manufacturing a semiconductor device according to an embodiment of the present invention.

As illustrated in FIGS. 3A and 3B, a plurality of first material layers 31 and a plurality of second material layers 32 are alternately formed. The first material layers 31 may form gate electrodes, such as selection transistors and memory cell transistors, and the second material layers 32 may form insulating layers that electrically disconnect the stacked gate electrodes.

The first material layers 31 may include a material having a etch selectivity higher than the second material layers 32. For example, the first material layers 31 may be formed as a sacrificial layer including nitride, and the second material layers 32 may be formed as an insulating layer including oxide. Alternatively, the first material layers 31 may be formed as a first sacrificial layer including nitride, and the second material layers 32 may be formed as a second sacrificial layer including oxide.

Furthermore, the first material layers 31 may be formed to have the same thickness as the second material layers 32, or a different thickness from the second material layers 32. According to an embodiment of the present invention, the thickness of the second portion of the conductive layers may be selectively increased. Therefore, when a stacked structure ST is formed, the first material layers 31 may have a thickness less than the second material layers 32, so that the total height of the stacked structure may be reduced and it may be easier to reduce the manufacturing process.

Subsequently, a semiconductor pattern 33 passing through the stacked structure ST is formed. For example, a hole H passing through the first and second material layers 31, 32 is formed, and then the semiconductor pattern 33 is formed in the hole H. The semiconductor pattern 33 may have an open center, a filled center, or a combination thereof. The open center may be filled with an insulating layer. Furthermore, before the semiconductor pattern 33 is formed, a dielectric layer (not illustrated) may be formed in the hole H. For example, the dielectric layer may include at least one of a charge blocking layer, a data storage layer, and a tunnel insulating layer. The data storage layer may include polysilicon, nitride, phase change material, and nanodot and so forth.

Subsequently, a slit SL passing through the first and second material layers 31, 32 is formed and the slit SL may have enough depth to expose all the first material layers 31. Furthermore, the slit SL may be formed in various shapes, such as a line or an island.

Although not illustrated in the drawings, after or before the slit SL is formed, a sidewall of the stacked structure ST may be patterned in a stepwise manner. For example, each step may include an upper second material layer 32 and a lower first material layer 31. Furthermore, each of the first material layers 31 includes the first and third portions R1 and R3 shown in of FIG. 1 and the second portion R2 shown in FIG. 1. The first materials layers 31 in the second portion R2 may extend more than the upper first material layer 31.

Figure 4A:
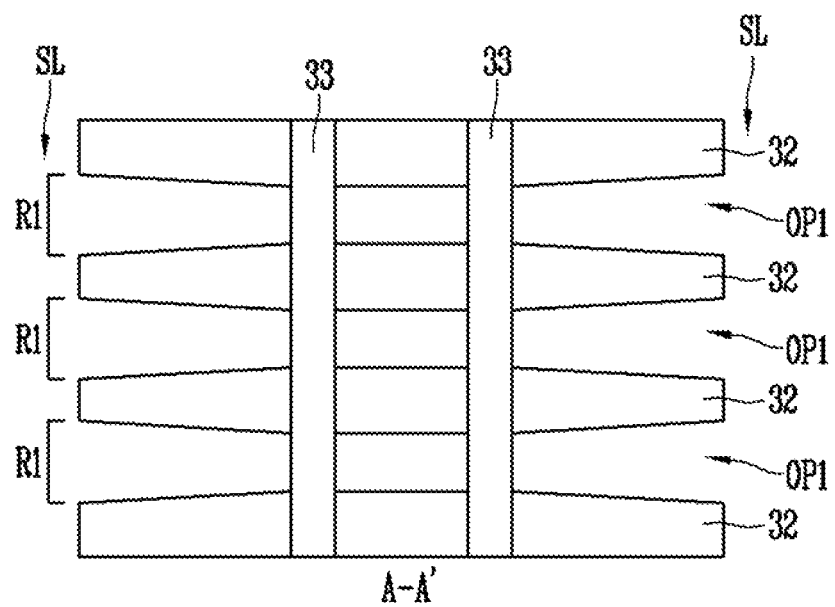
FIG. 4A is a cross-sectional view illustrating a method of manufacturing a semiconductor device according to an embodiment of the present invention.
Figure 4B:
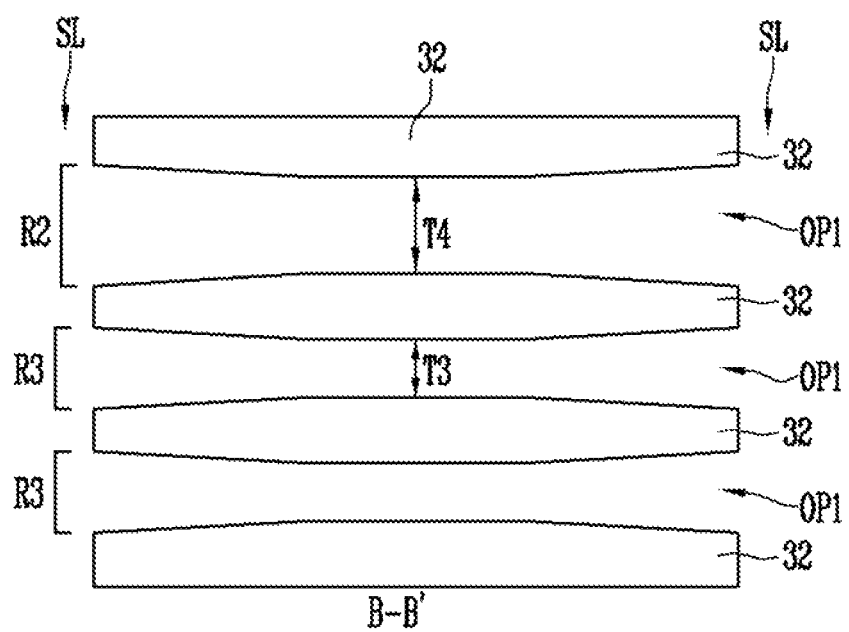
FIG. 4B is a cross-sectional view illustrating a method of manufacturing a semiconductor device according to an embodiment of the present invention.

As illustrated in FIGS. 4A and 4B, the first material layers 31 exposed by the slit SL are removed to form first openings OP1. The first openings OP1 have a first thickness T3. Since the first material layers 31 are removed through the slit SL, as the first openings OP1 are closer to the slit SL, the thickness of the first openings OP1 may be increased. That is, the second material layers 32 are closer to the slit SL, the thickness of the second material layers 32 may be reduced so that the second material layers 32 may have a trapezoidal shape.

Subsequently, the thickness of the second portion R2 of each of the first openings OP1 is selectively increased that is, T4>T3. The thickness of the portions corresponding to the second portion R2 patterned in a stepwise manner, as shown in FIG. 1, is selectively increased. For example, the second portion R2 of the second material layers 32 patterned in a stepwise manner and exposed, is doped with impurities. Since the region doped with impurities may have a etch rate higher than an undoped region, the doped region of the second material layer 32 may also be removed when the first material layers 31 are removed. Therefore, the first openings OP1 of the second portion R2 may have a thickness greater than the first and third portions R1 and R3, that is, T4>T3.

Figure 5A:
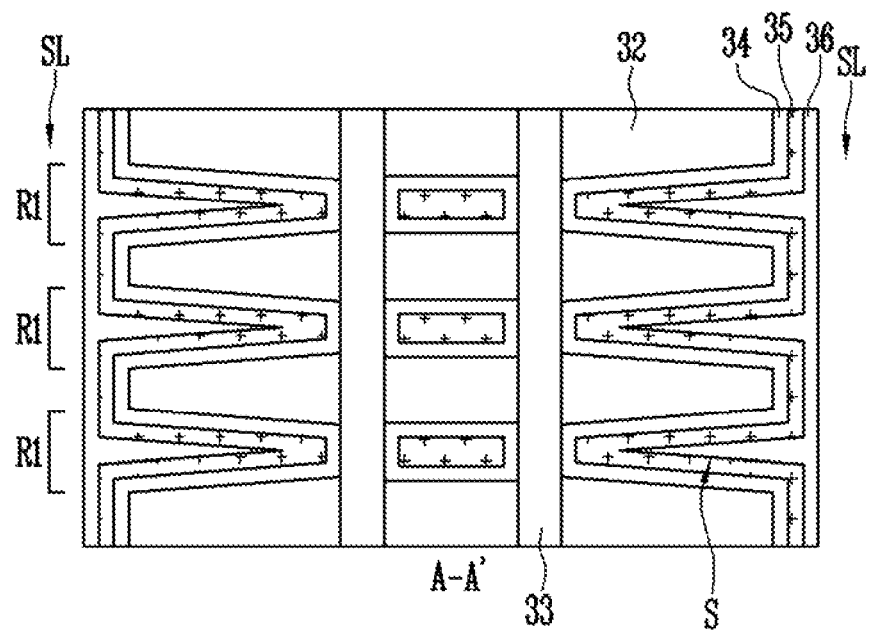
FIG. 5A is a cross-sectional view illustrating a method of manufacturing a semiconductor device according to an embodiment of the present invention.
Figure 5B:
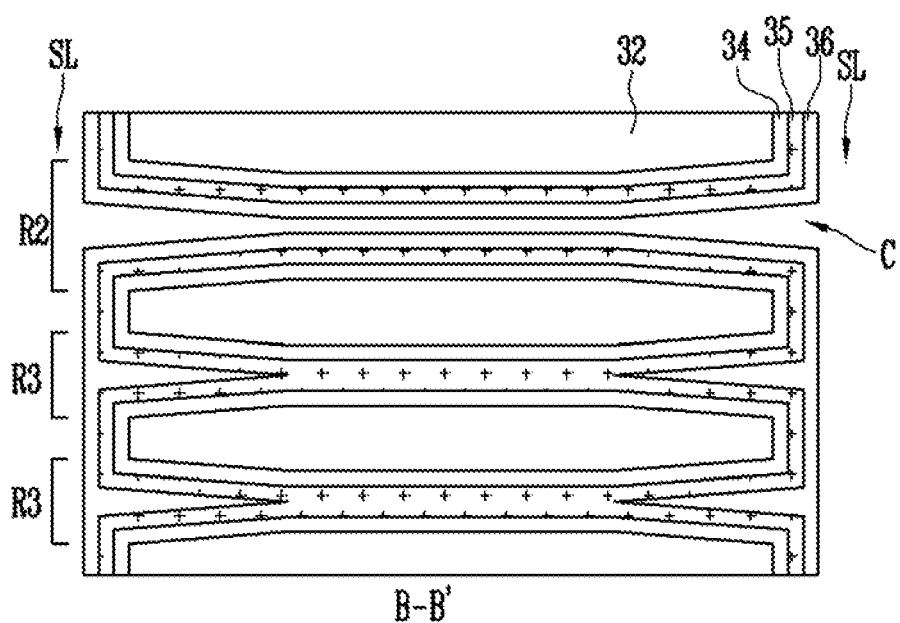
FIG. 5B is a cross-sectional view illustrating a method of manufacturing a semiconductor device according to an embodiment of the present invention.

As illustrated in FIGS. 5A and 5B, a first barrier layer 34 is formed in the first openings OP1 shown in FIGS. 4A and 4B. A first barrier layer 34 may be formed along inner surfaces of the first openings OP1 and the slit SL. For example, the first barrier layer 34 includes at least one of titanium, titanium nitride, tantalum, and tantalum nitride. A dielectric layer (not illustrated) may be formed before the first barrier layer 34 is formed. The dielectric layer may include at least one of a charge blocking layer, a data storage layer, and a tunnel insulating layer. The dielectric layer may include polysilicon, nitride, phase change material, nanodots and so forth.

Subsequently, a third material layer 35 having an etch selectivity with respect to the first barrier layer 34 is formed in the first openings OP1 where the first barrier layer 34 is formed. The third material layer 35 may be formed along the inner surface of the first openings OP1 and the slit SL. The third material layer 35 may include at least one of oxide, nitride, silicon oxide, silicon nitride, polysilicon, germanium, and silicon germanium.

The third material layer 35 may include a seam S in a portion along the thickness of the first opening OP1. For example, in the first and third portions R1 and R3 having a relatively small thickness T3 as shown in FIG. 4B, the third material layer 35 includes the seam S that completely fills the center of the first opening OP1 and is located at the side. Additionally, in the second portion R2 having the relatively large thickness T4 as shown in FIG. 4B, the third material layer 35 is formed to have a uniform thickness along the surface of the first barrier layer 34 and does not completely fill the first opening OP1. The depth of the seam S may differ according to the thickness of the first opening OP1.

Subsequently, a sacrificial layer 36 is formed in the first openings OP1 where the third material layer 35 is formed. The sacrificial layer 36 may be formed along the inner surfaces of the first openings OP1 and the slit SL. For example, the sacrificial layer 36 may include at least one of titanium, titanium nitride, tantalum and tantalum nitride.

In the first and third portions R1 and R3 having the relatively small thickness T3, the sacrificial layer 36 is formed to fill the seam S in the third material layer 35.

Furthermore, in the second portion R2 having the relatively large thickness T4, the sacrificial layer 36 is formed to have a uniform thickness along the surface of the opening OP1 and does not completely fill the first opening OP1. (see reference character "C")

Figure 6A:
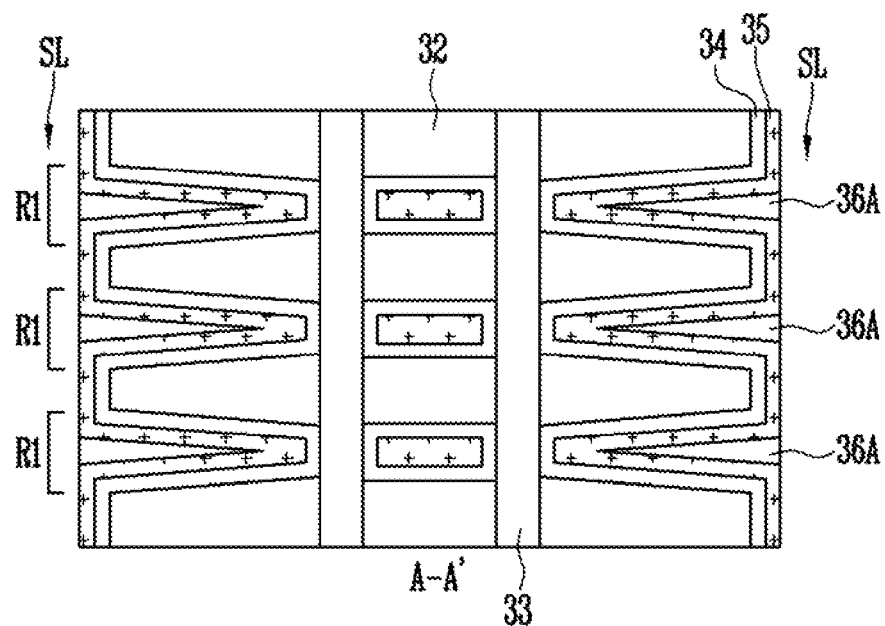
FIG. 6A is a cross-sectional view illustrating a method of manufacturing a semiconductor device according to an embodiment of the present invention.
Figure 6B:
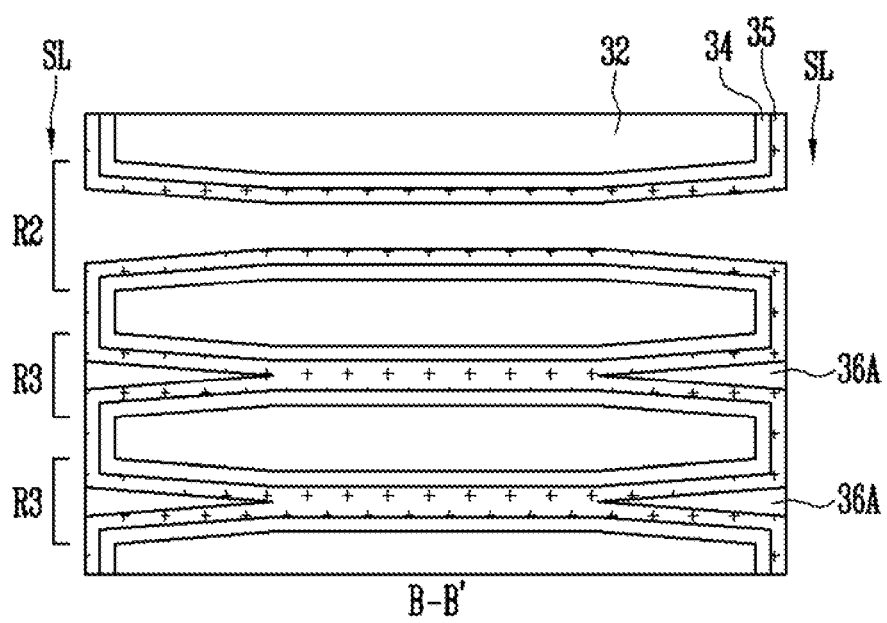
FIG. 6B is a cross-sectional view illustrating a method of manufacturing a semiconductor device according to an embodiment of the present invention.

As illustrated in FIGS. 6A and 6B, the sacrificial layer 36 shown in FIGS. 5A and 5B, is partially etched so that the third material layer 35 is exposed. For example, the sacrificial layer 36 is selectively etched using a dry etching or cleaning process. The sacrificial layer 36 in the slit SL is removed from the first and third portions R1 and R3. However, the sacrificial layer 36 filling the seam S of the third material layer 35 is not removed. As a result, sacrificial patterns 36A that fill the seam S of the third material layer 35 shown in FIG. 5A, are formed. Since the sacrificial layer 36 does not completely fill the first opening OP1 in the second portion R2, a larger area is exposed to etching gas. The sacrificial layer 36 may be completely removed from the second portion R2, and the third material layer 35 in the first opening OP1 may be exposed since the sacrificial layer 36 is etched at a relatively fast speed.

Figure 7A:
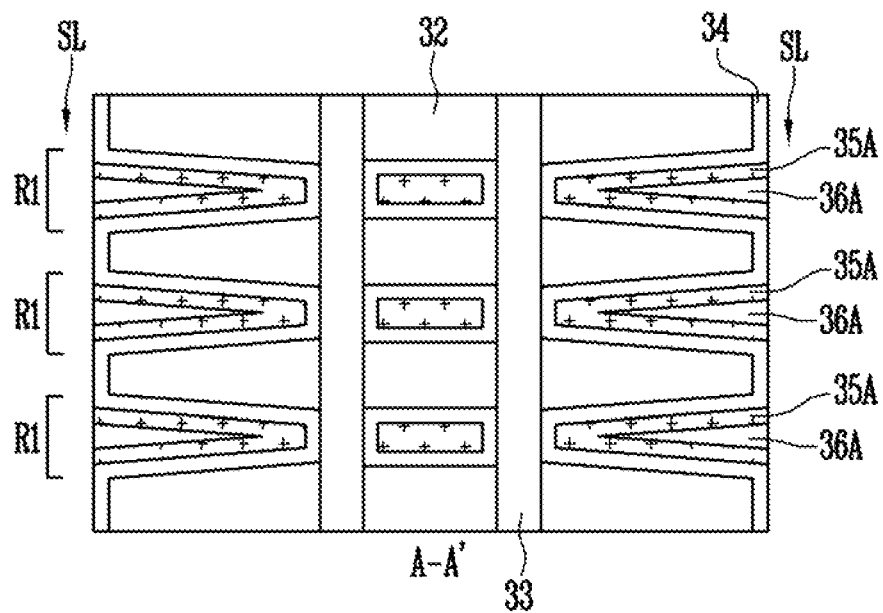
FIG. 7A is a cross-sectional view illustrating a method of manufacturing a semiconductor device according to an embodiment of the present invention.
Figure 7B:
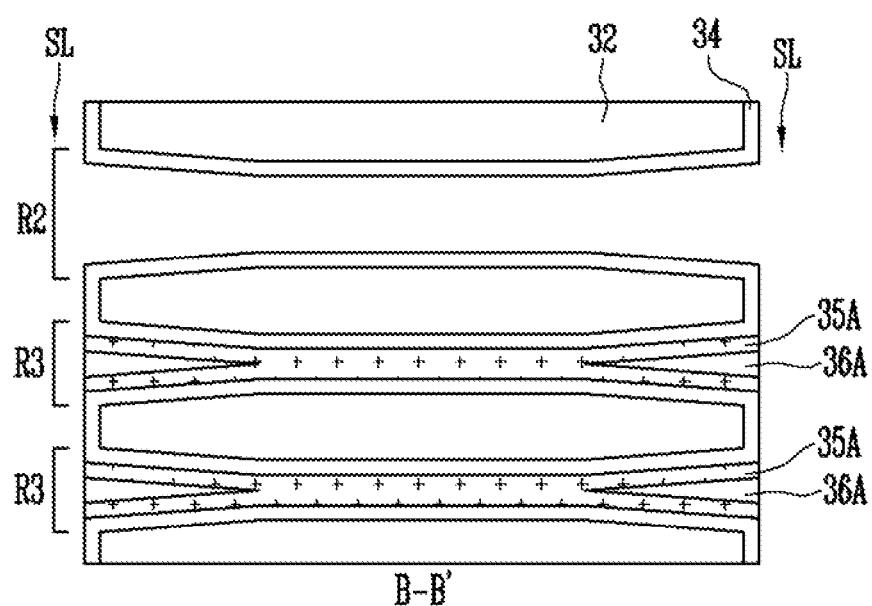
FIG. 7B is a cross-sectional view illustrating a method of manufacturing a semiconductor device according to an embodiment of the present invention.

As illustrated in FIG. 7A and FIG. 7B, the third material layer 35 is partially etched to form a preliminary third material pattern 35A. For example, by etching the third material layer 35 using dry etching or a cleaning process, the preliminary third material pattern 35A is formed in the first and third portion R1 and R3. The preliminary material pattern 35A is formed in each of the first openings OP1 by etching the third material layer 35 formed in the slit S. Since the third material layer 35 is etched at a relatively fast speed from the second portion R2, the third material layer 35 may be completely removed, and the first barrier layer 34 in the first opening OP1 may be exposed.

Figure 8A:
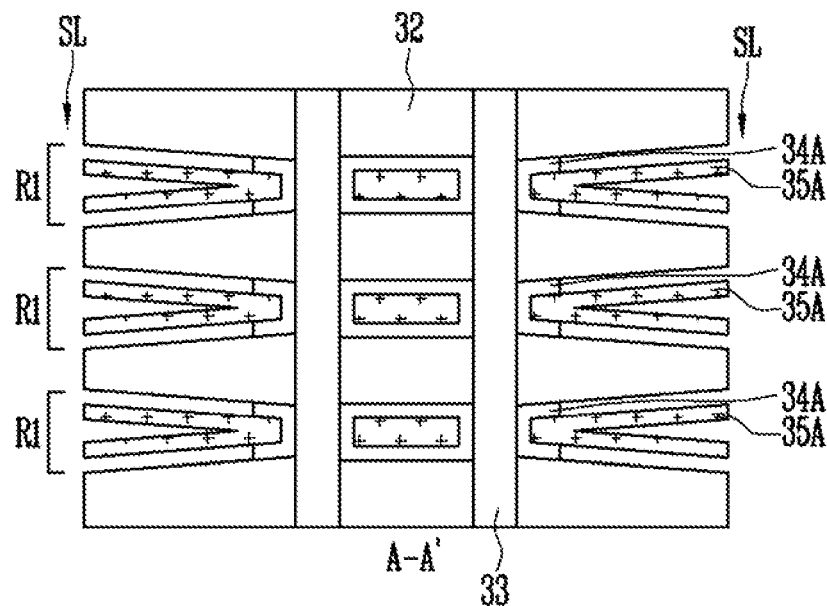
FIG. 8A is a cross-sectional view illustrating a method of manufacturing a semiconductor device according to an embodiment of the present invention.
Figure 8B:
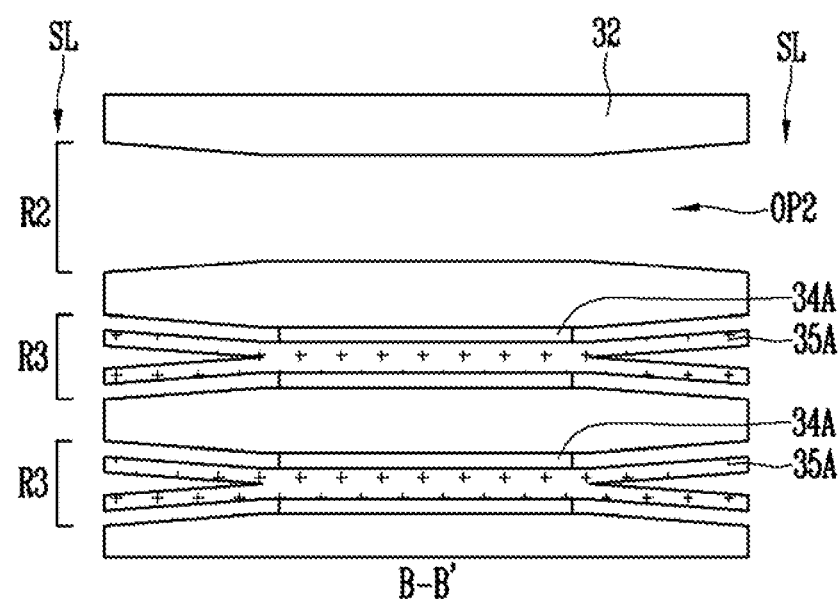
FIG. 8B is a cross-sectional view illustrating a method of manufacturing a semiconductor device according to an embodiment of the present invention.

As illustrated in FIGS. 8A and 8B, the first barrier layer 34 and sacrificial pattern 36A shown in FIGS. 7A and 7B, are etched. For example, the first barrier layer 34 and sacrificial pattern 36A may be etched using a wet etching process. In the first and third portions R1 and R3, the first barrier pattern 34A is formed and the sacrificial pattern 36A is removed. In the second portion R2, all the first barrier layers 34 may be removed to form the second opening OP2.

Figure 9A:
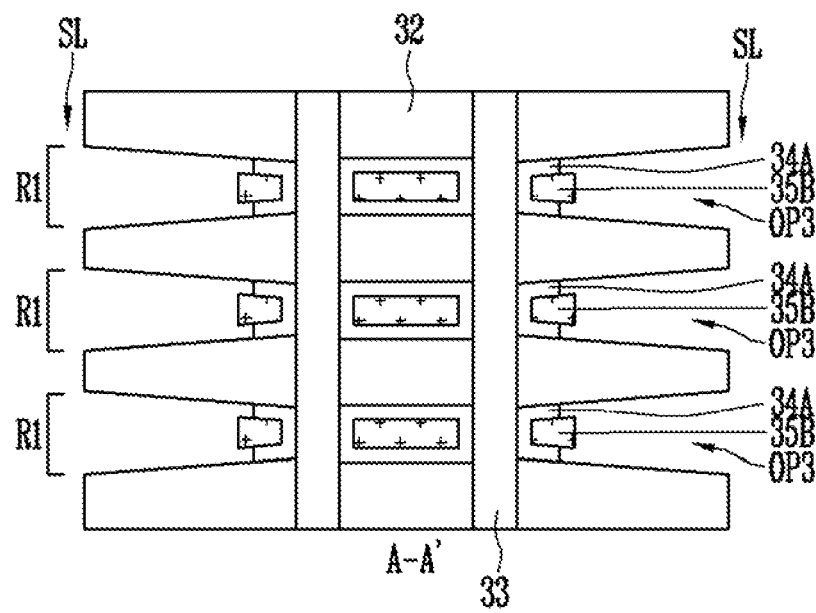
FIG. 9A is a cross-sectional view illustrating a method of manufacturing a semiconductor device according to an embodiment of the present invention.
Figure 9B:
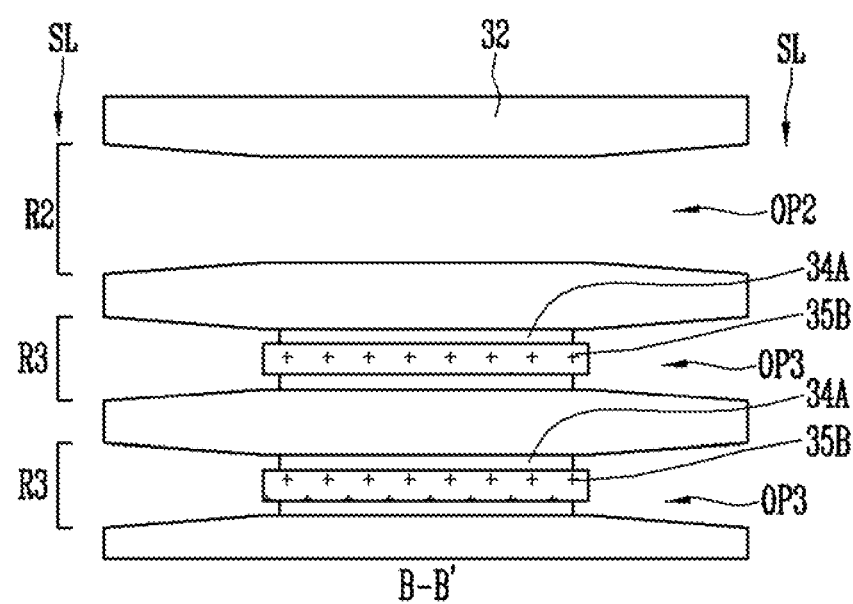
FIG. 9B is a cross-sectional view illustrating a method of manufacturing a semiconductor device according to an embodiment of the present invention.

As illustrated in FIGS. 9A and 9B, material patterns 35B may be formed by etching the preliminary material patterns 35A shown in FIGS. 8A and 8B, so that third openings OP3 are formed. The second and third openings OP2 and OP3 are regions where conductive patterns are formed. The second opening OP2 and the third opening OP3 which are located at each level, may be connected to each other. Furthermore, depending on etching conditions, the material patterns 35B may protrude compared to the first barrier patterns 34A, or the first barrier patterns 34A may protrude compared to the material patterns 35B.

Figure 10A:
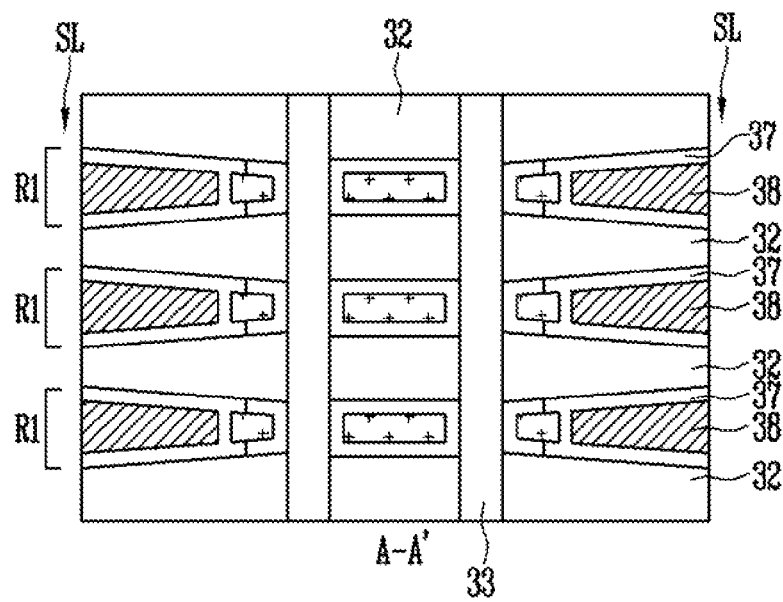
FIG. 10A is a cross-sectional view illustrating a method of manufacturing a semiconductor device according to an embodiment of the present invention.
Figure 10B:
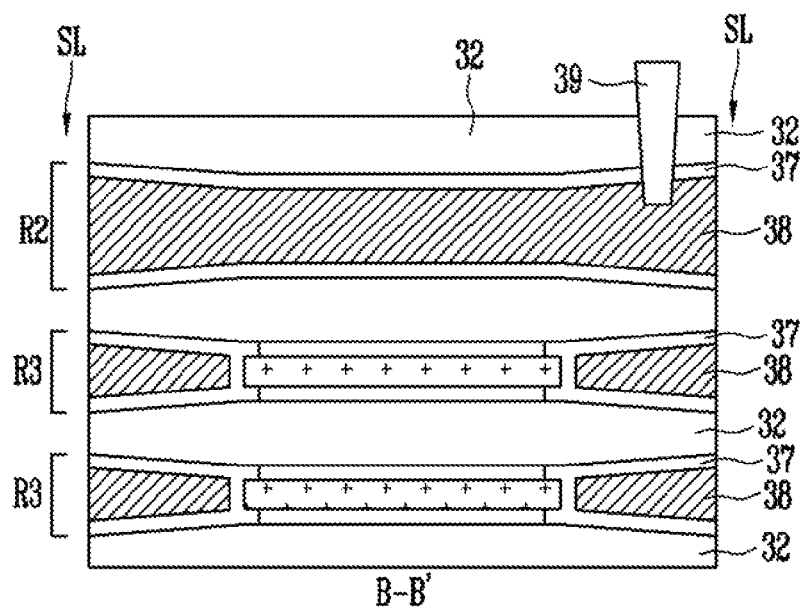
FIG. 10B is a cross-sectional view illustrating a method of manufacturing a semiconductor device according to an embodiment of the present invention.

As illustrated in FIGS. 10A and 10B, a conductive pattern 38 is formed in the second and third openings OP2 and OP3 shown in FIGS. 9a and 9B. A second barrier pattern 37 may be formed in the second and third openings OP2 and OP3 before the conductive pattern 38 is formed. The second barrier pattern 37 may include at least one of titanium, titanium nitride, tantalum and tantalum nitride. Furthermore, the conductive pattern 38 may include at least one of tungsten and tungsten nitride.

When the third material pattern 35B protrudes compared to the first barrier pattern 34A, the second barrier pattern 37 is formed to surround a protruding region of the material pattern 35B. That is, a portion of the material pattern 35B may protrude compared to the first barrier pattern 34A and may be embedded in the second barrier pattern 37.

Although not illustrated in the drawings, when the first material layers 31 are first sacrificial layers, and the second material layers 32 are second sacrificial layers, an additional process of replacing the second material layers 32 with insulating layers may be performed. For example, after the openings are formed by removing the second material layers 32 through the slit SL, the insulating layers may be formed in the openings.

Furthermore, instead of forming the third material layer 35, the first barrier layer 34 may be formed to be very thick. Additionally, the conductive layers described above with reference to aforementioned FIGS. 2A to 2C, may be formed.

Figure 11:
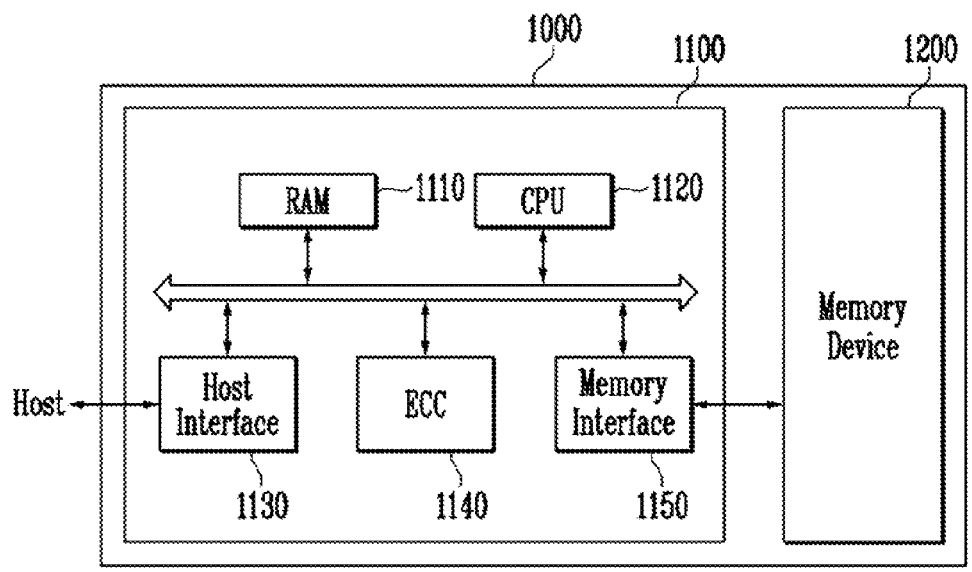
FIG. 11 is a block diagram illustrating a memory system according to an embodiment of the present invention.

FIG. 11 is a block diagram illustrating a memory system 1000 according to an embodiment of the present invention.

As illustrated in FIG. 11, the memory system 1000 may include a memory device 1200 and a controller 1100.

The memory device 1200 may store data information leaving various data formats such as text, graphic, software code and so forth. The memory device 1200 may be a nonvolatile memory, and may include the structure described above in FIGS. 1 to 10B. Furthermore, the memory device 1200 may include a semiconductor pattern; conductive layers each including a first portion through which the semiconductor pattern passes and a second portion having a thickness greater than the first portion, wherein the first portion of each conductive layer includes a first barrier pattern surrounding the semiconductor pattern and a material pattern which is formed in the first barrier pattern, and has an etch selectivity with respect to the first barrier pattern, and the second portion of each conductive layer includes a conductive pattern; and contact plugs connected to the second portion of each of the conductive layers. Since the structure and manufacturing method of the memory device 1200 are the same as described above, a further description is omitted.

The controller 1100 may be coupled to a host and the semiconductor memory device 100. The controller 1200 may access the semiconductor memory device 100 in response to a request from the host. For example, the memory controller 1200 may control read, write, erase and background operations of the semiconductor memory device 100.

The controller 1110 may include a random access memory (RAM) 1110, a processing unit 1120, a host interface 1130, a memory interface 1140 and an error correcting code block 1150

The RAM 1110 may function as at least one of the operation memories of the processing unit 1220, a cache memory between the semiconductor memory device 100 and the host, and a buffer memory between the semiconductor memory device 100 and the host. Moreover, the RAM 1110 may be replaced with read only memory (ROM).

The CPU 1120 may control overall operations of the controller 1100. For example, the CPU 1120 may include operate firmware such as a flash translation layer (FTL) stored in the RAM 1110.

The host interface 1130 may perform interfacing with the host. For example, the controller 1100 may communicate with the host through one of various interface protocols including a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol and a private protocol.

The ECC circuit 1140 may detect an error included in data read from the memory device 1200 using an error correction code (ECC) circuit 1140, and then correct the error.

The memory interface 1150 may perform interfacing with the memory device 1200. For example, the memory interface 1150 includes a NAND flash interface or a NOR flash interface.

The controller 1100 may further include a buffer memory (not illustrated) for temporarily storing data. The buffer memory may temporarily store data transmitted from outside through the host interface 1130 or temporarily store data transmitted from the memory device 1200 through the memory interface 1150. Furthermore, the controller 110 may further include ROM for storing code data for interfacing with the host.

Since the memory system 1000 includes a memory device 1200 with an improved degree of integration, the degree of integration of the memory system 1000 may be improved.

Figure 12:
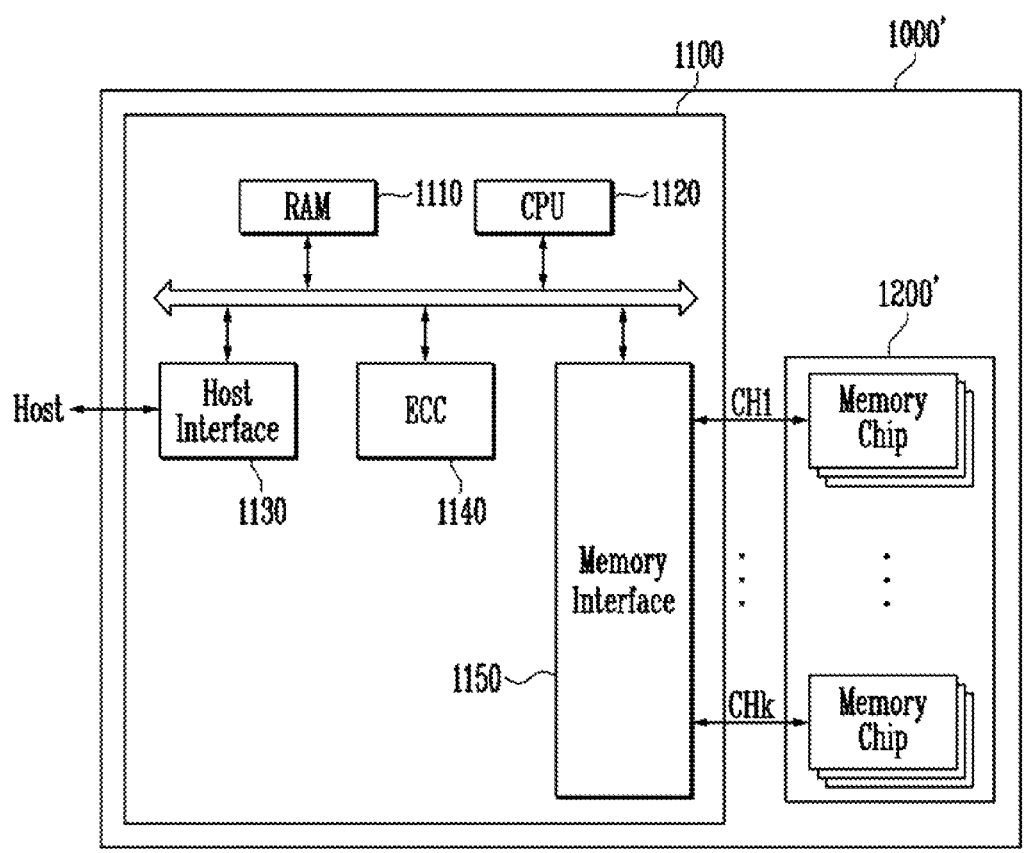
FIG. 12 is a block diagram illustrating a memory system according to an embodiment of the present invention.

FIG. 12 is a block diagram illustrating a memory system 1000 according to an embodiment of the present invention. Hereinbelow, a detailed description of the earlier described common functions and embodiments will be omitted.

As illustrated in FIG. 12, the memory system 1000 may include a memory device 1200' and the controller 1100. Furthermore, the controller 1100 includes a RAM 1110, a CPU 1120, a host interface 1130, an ECC circuit 1140, and a memory interface 1150.

The memory device 1200' may be a nonvolatile memory, and may include the memory string described above with reference to FIGS. 1 to 10B. Furthermore, the memory device 1200' may include a semiconductor pattern; conductive layers each including a first portion through which the semiconductor pattern passes and a second portion having a thickness greater than the first portion, wherein the first portion of each conductive layer includes a first barrier pattern surrounding the semiconductor pattern and a material pattern which is formed in the first barrier pattern, and has an etch selectivity with respect to the first barrier pattern, and the second portion of each conductive layer includes a conductive pattern; and contact plugs connected to the second portion of each of the conductive layers. Since the structure and manufacturing method of the memory device 1200' are the same as aforementioned, a further description thereof is omitted.

Furthermore, the memory device 1200' may be a multi-chip package consisting of a plurality of memory chips. The memory chips are divided into a plurality of groups, which are configured to communicate with the controller 1100 through 1 to k channels CH1 to CHk. Furthermore, the memory chips belonging to one group may communicate with the controller 1100 through a common channel. The memory system 1000' may be modified such that one memory chip is connected to one channel.

As described above, since the memory system 1000' includes the memory device 1200' with an improved degree of integration, the degree of integration of the memory system 1000' may be improved. Since the memory device 1200' is configured as a multi-chip package, the data storage capacity of the memory system 1000' and the driving speed may be increased.

Figure 13:
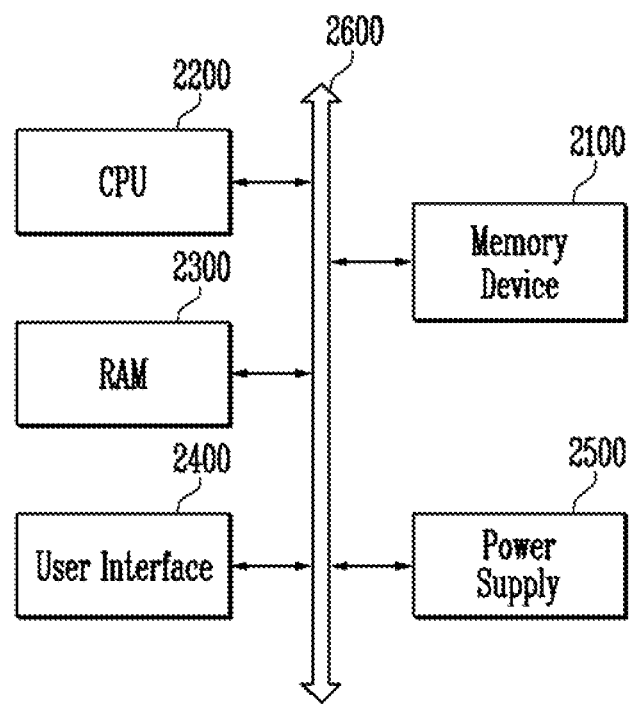
FIG. 13 is a block diagram illustrating a computing system according to an embodiment of the present invention.

FIG. 13 is a block diagram illustrating a computing system 2000 according to an embodiment of the present invention. Hereinbelow, a detailed description of the earlier described common functions and embodiments will be omitted.

As illustrated in FIG. 13, the computing system 2000 may include a memory device 2100, a CPU 2200, RAM 2300, a user interface 2400, a power supply 2500, and a system BUS 2600.

The memory device 2100 stores data provided through the user interface 2400 and data processed by the CPU 2200. Furthermore, the memory device 2100 is electrically connected to the CPU 2200, the RAM 2300, the user interface 2400, and the power supply 2500 through a system BUS 2600. For example, the memory device 2100 may be connected to the system BUS 2600 directly or through a controller (not illustrated). When the memory device 2100 is directly connected to the system BUS 2600, functions of the controller may be performed by the CPU 2200 and RAM 2300.

The memory device 2100 may be a nonvolatile memory, and may include the memory string described above with reference to FIGS. 1 to 10B. Furthermore, the memory device 2100 may include a semiconductor pattern; conductive layers each including a first portion through which the semiconductor pattern passes and a second portion having a thickness greater than the first portion, wherein the first portion of each conductive layer includes a first barrier pattern surrounding the semiconductor pattern and a material pattern which is formed in the first barrier pattern, and has an etch selectivity with respect to the first barrier pattern, and the second portion of each conductive layer includes a conductive pattern; and contact plugs connected to the second portion of each of the conductive layers. Since the structure and manufacturing method of the memory device 2100 are the same as aforementioned, a detailed description is omitted.

Furthermore, as described with reference to FIG. 12, the memory device 2100 may be a multi-chip package including a plurality of memory chips.

The computing system 2000 with such a configuration, may be used as one of various components of an electronic device, such as a computer, an ultra-mobile PC (UMPC), a workstation, a net-book, personal digital assistant (PDA), a portable computer, a web tablet, a wireless phone, a mobile phone, a smart phone, an e-book, a portable multimedia player (PMP), a portable game machine, a navigation device, a black box, a digital camera, a 3D television, a digital audio recorder, a digital audio player, a digital picture recorder, a digital picture player, a digital video recorder, a digital video player, a device for transmitting/receiving information in wireless environment, one of various electronic devices for home networks, one of various electronic devices for computer networks, one of various electronic devices for telematics networks, an RFID device and/or one of various devices for computing systems, etc.

As described above, since the computing system 2000 according to the embodiment of the present invention includes a memory device with improved degree of integration, the data storage capacity of the computing system 200 may be improved.

Figure 14:
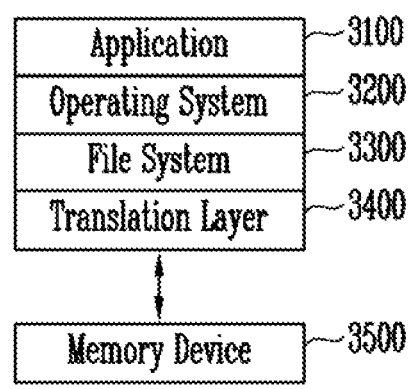
FIG. 14 is a block diagram illustrating a computing system according to an embodiment of the present invention.

FIG. 14 is a block diagram illustrating a computing system according to the embodiment of the present invention.

As illustrated in FIG. 14, a computing system 3000 according to the embodiment of the present invention includes an operation system 3200, an application 3100, a file system 3300, and a software layer including a translation layer 3400. Furthermore, the computing system 3000 includes a hardware layer such as a memory device 3500.

The operating system 3200 may manage software and hardware resources of the computing system 3000. The operating system 3100 may control program execution of a central processing unit. The application 3200 may include various application programs executed by the operating system 3100.

The file system 3300 may refer to a logical structure configured to manage data and files present in the computing system 3000. The file system 3300 may organize files or data to be stored in the memory device 3500 according to rules. The file system 3300 may be determined depending on the operating system 3100, which is used in the computing system 3000. For example, when the operating system 3100 is a Microsoft Windows-based system, the file system 3300 may be a file allocation table (FAT) or an NT file system (NTFS). Additionally, when the operating system 3100 is a Unix/Linux-based system, the file system 3300 may be an extended file system (EXT), a UNIX file system (UFS) or a journaling file system (JFS).

FIG. 14 illustrates the operating system 3100, the application 3200 and the file system 3300 in separate blocks. However, the application 3200 and the file system 3300 may be included in the operating system 3100.

The translation layer 3400 may translate an address to be suitable for the memory device 3500 in response to a request from the file system 3300. For example, the translation layer 3400 may translate a logic address generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a nonvolatile memory, and may include the memory string described above with reference to FIGS. 1 to 10B above. Furthermore the memory device 3500 may include a semiconductor pattern; conductive layers each including a first portion through which the semiconductor pattern passes and a second portion having a thickness greater than the first portion, wherein the first portion of each conductive layer includes a first barrier pattern surrounding the semiconductor pattern and a material pattern which is formed in the first barrier pattern, and has an etch selectivity with respect to the first barrier pattern, and the second portion of each conductive layer includes a conductive pattern; and contact plugs connected to the second portion of each of the conductive layers. The structure and manufacturing method of the memory device 3500 are the same as aforementioned, and thus further description is omitted.

The computing system 3000 having the above-described configuration may be divided into an operating system layer that is operated in an upper layer region and a controller layer that is operated in a lower level region. The application 3100, the operating system 3200 and the file system 3300 may be included in the operating system layer and driven by an operation memory. Furthermore, the translation layer 3400 may be included in the operating system layer or the controller layer.

As described above, since the computing system 3000 includes the memory device 3500 having an improved degree of integration, the data storage capacity of the computing system 3000 may be improved.

According to an embodiment of the present invention, it may be possible to reduce the difficulty of manufacturing a semiconductor device, and prevent adjacent layers from being damaged during the manufacturing process. Therefore, characteristics of a semiconductor device may be secured. In the drawings and specification, there have been disclosed exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
    forming a stacked structure including a semiconductor pattern, and first material layers and second material layers stacked alternately to surround the semiconductor pattern;
    forming a slit passing through the stacked structure;
    forming first openings by removing the first material layers through the slit;
    forming a first barrier layer in the first openings and the slit;
    forming a third material layer in the first openings and the slit where the first barrier layer is formed, wherein the third material layer has an etch selectivity with respect to the first barrier layer and includes seams located in the first openings;
    forming sacrificial patterns filling the seams;
    forming second openings by partially etching the first barrier layer, the third material layer, and the sacrificial patterns formed in the first openings; and
    forming conductive patterns in the second openings.

2. The method according to claim 1, herein the forming of the second openings comprises:
    forming preliminary third material patterns by etching the third material layer exposed by the sacrificial pattern;
    forming a first barrier pattern by etching a portion of the first barrier layer;
    removing the sacrificial patterns; and
    forming third material patterns by etching the preliminary third material patterns exposed by the first barrier pattern.

3. The method according to claim 1, further comprising patterning a side wall of the stacked structure in a stepwise manner such that a first portion of each first material layer is disposed between an upper first material layer and a lower first material layer and a second portion extending from the first portion is exposed.

4. The method according to claim 3, wherein each of the first openings comprises a third portion disposed between the upper second material layer and the lower second material layer and a fourth portion extending from the third portion and having a thickness greater than the first portion.

5. The method according to claim 4, wherein the third material layer comprises a seam located in a side of the third portion and has a thickness to open the fourth portion.

6. The method according to claim 5, wherein the forming of the sacrificial patterns comprises:
    forming a sacrificial layer in the first openings and the slit so that the sacrificial layer has a thickness to fill the seam and to open the fourth portion; and
    forming the sacrificial patterns by removing the sacrificial layer formed in the slit and the fourth portion.

7. The method according to claim 4, wherein during the forming of the fourth openings, the first barrier layer and the third material layer formed in the fourth portion are completely removed.

8. The method according to claim 4, wherein each of the conductive patterns comprises a fifth portion through which the semiconductor pattern passes, a sixth portion extending from the fifth portion and having a thickness greater than the fifth portion, and a seventh portion located between the fifth portion and the sixth portion.

9. The method according to claim 8, further comprising forming contact plugs connected to the sixth portion of each of the conductive patterns.

10. The method according to claim 1, further comprising forming second barrier patterns surrounding the conductive patterns before forming the conductive patterns.

* * * * *